(12) United States Patent
Hong et al.

(10) Patent No.: US 7,858,492 B2
(45) Date of Patent: Dec. 28, 2010

(54) METHOD OF FILLING A TRENCH AND METHOD OF FORMING AN ISOLATING LAYER STRUCTURE USING THE SAME

(75) Inventors: Eunkee Hong, Seongnam-si (KR);
Kyung-Mun Byun, Seoul (KR);
Jong-Wan Choi, Suwon-si (KR);
Eun-Kyung Baek, Suwon-si (KR);
Young-Sun Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/339,125

(22) Filed: Dec. 19, 2008

(65) Prior Publication Data
US 2009/0191687 A1 Jul. 30, 2009

(30) Foreign Application Priority Data
Dec. 21, 2007 (KR) .................. 10-2007-0135279

(51) Int. Cl.
*H01L 21/76* (2006.01)
(52) U.S. Cl. .............. 438/435; 438/433; 438/424; 438/427; 438/437
(58) Field of Classification Search .......... 438/424, 438/437, 427, 433, 435
See application file for complete search history.

(56) References Cited

U.S. PATENT DOCUMENTS

| 6,245,684 B1 * | 6/2001 | Zhao et al. ............. 438/704 |
| 6,780,731 B1 | 8/2004 | Tu et al. |
| 7,169,676 B1 * | 1/2007 | Zhong ................. 438/302 |
| 2003/0230549 A1 * | 12/2003 | Buchanan et al. ......... 216/41 |
| 2006/0145287 A1 * | 7/2006 | Kim ..................... 257/510 |
| 2006/0166419 A1 * | 7/2006 | Shimoyama et al. ...... 438/173 |

FOREIGN PATENT DOCUMENTS

| KR | 0406180 | 11/2003 |
| KR | 0624327 | 9/2006 |

* cited by examiner

*Primary Examiner*—Ha Tran T Nguyen
*Assistant Examiner*—Aaron A Dehne
(74) *Attorney, Agent, or Firm*—Volentine & Whitt, PLLC

(57) ABSTRACT

A method of filling a trench in a substrate ensures that a void or seam is not left in the material occupying the trench. First, a preliminary insulating layer is formed so as to extend contiguously along the bottom and sides of the trench and along an upper surface of the substrate. Impurities are then implanted into a portion of the preliminary insulating layer adjacent the top of the first trench to form a first insulating layer having a doped region and an undoped region. The doped region is removed to form a first insulating layer pattern at the bottom and sides of the first trench, and which first insulating layer pattern defines a second trench. The second trench is then filled with insulating material.

20 Claims, 8 Drawing Sheets

METHOD OF FILLING A TRENCH AND METHOD OF FORMING AN ISOLATING LAYER STRUCTURE USING THE SAME

BACKGROUND OF THE INVENTION

1. Field of the Invention

The present invention relates to the fabricating of a semiconductor device. More particularly, the present invention relates to a method of filling a trench in a semiconductor substrate, and to a method of forming an isolating layer structure which defines an active region and a field region of a semiconductor substrate.

2. Description of the Related Art

Semiconductor devices constitute the main electronic components, such as transistors and diodes, of today's electronic devices. Also, the array of electronic devices, such as personal computers, in wide-spread use is constantly increasing. For each of its new applications, an electronic device must often store greater and greater quantities of electronic data and process data at higher and higher speeds. Accordingly, semiconductor devices are being developed with an aim towards improving the degree to which they are integrated, their reliability, and their-responsiveness (operating speed).

To these ends, electrically isolating electronic components on a semiconductor substrate has taken on a greater importance in the fabricating of an integrated semiconductor device. Also, the forming of the structure that will electrically isolate the various electronic components, i.e., the forming of an "isolation" structure, is usually the first of several main processes in the fabricating of an integrated semiconductor device. Therefore, the process used for forming the isolation structure can significantly affect the size of the device and process margins of subsequent processes.

Generally, an isolation layer is the most widely used structure for isolating electronic components on a substrate, due to the fact that it may be produced by a simple process. For example, an isolation layer may be formed by a thermal field oxidation process such as a local oxidation of silicon (LOCOS) process. According to the LOCOS process, an oxide layer and a nitride layer are sequentially formed on a silicon substrate. The nitride layer is then patterned. Next, the silicon substrate is selectively oxidized using the patterned nitride layer as a mask to form a field oxide layer. The non-oxidized portions of the substrate left between respective portions of the field oxide layer become the active region of the substrate on which electronic components are subsequently formed.

However, oxygen may infiltrate into the sides of the oxide layer under the mask (patterned nitride layer) while the silicon substrate is being oxidized. As a result, a so-called bird's beak is formed at each side of the field oxide layer. The bird's beak extends the field oxide layer into an active region. That is, the size of the active region is in effect reduced. Hence, electrical characteristics of the semiconductor device are degraded.

Therefore, a shallow trench isolation (STI) process has been used as an alternative to the LOCOS process to form an isolation structure. According to the STI process, first, a silicon substrate is etched to form a trench. An oxide layer is then formed on the silicon substrate to such a thickness as to overfill the trench. Finally, the oxide layer is etched or polished (planarized) by an etch-back process or a chemical mechanical polishing (CMP) process until the upper surface of the substrate is exposed. The portion of the oxide layer left in the trench constitutes a field oxide layer.

However, the active region and field region are becoming smaller as the degree to which semiconductor devices become integrated increases. Thus, the trenches used for forming the isolation structure are becoming narrower and deeper. Likewise, the aspect ratio of the trenches (the ratio of the depth to width of the trench) is increasing. Accordingly, it is becoming increasingly difficult to fill such trenches with an oxide layer without voids or a seam being produced in the layer.

In view of such potential problems and difficulties, a high density plasma enhanced chemical vapor deposition (HDP-CVD) process has been employed for filling relatively narrow trenches with an oxide having a good gap filling characteristic. Examples of such an oxide include $O_3$-tetra ethyl ortho silicate ($O_3$-TEOS) and undoped silicate glass (USG). However; $O_3$-TEOS or USG deposited by HDP-CVD may build up excessively at the entrance of the trench such that the final oxide layer does not fill the trench completely. Furthermore, a seam may be produced in a portion of the oxide layer which protrudes from the trench as will be described below with respect to FIGS. 1A-1D which illustrate a conventional method of forming an isolation layer.

Referring to FIG. 1A, a pad oxide layer 12 is formed on a semiconductor substrate 10 by a thermal oxidation process. A nitride layer (not shown) is then formed on the pad oxide layer 12. The nitride layer is patterned to form a pad nitride layer pattern 14.

Referring to FIG. 1B, the pad oxide layer 12 and the semiconductor substrate 10 may are etched using the pad nitride layer pattern 14 as an etch mask to form a trench 16. A liner oxide layer 18 is then formed along the substrate 10 within the trench 16 by a thermal oxidation process.

Referring to FIG. 1C, silicon oxide is deposited on the sides and bottom of the trench 16 and an upper surface of the pad nitride layer pattern 14 to form a silicon oxide layer 20 by an HDP-CVD process. Reaction gases of the HDP-CVD process may include a mixture of silicon nitride ($SiN_4$) gas and oxygen ($O_2$). Furthermore, the plasma source gas of the HDP-CVD process may be helium (He).

However, as the silicon oxide layer 20 is being formed, the silicon oxide on upper portions of the sides of the trench 16 may be sputtered due to the nature of the HDP-CVD process. The sputtered silicon oxide adheres to the silicon oxide already deposited at the side of the trench 16 opposite that from which the silicon oxide is sputtered. As a result, an overhang "A" is produced in the silicon oxide layer 20. The overhang "A" hangs over the remaining unfilled portion of the trench 16 forming a neck in the unfilled portion of the trench where the upper part of the unfilled portion of the trench is narrower than the lower part of the unfilled portion of the trench.

Referring to FIG. 1D, the silicon oxide layer 20 may be planarized by a CMP process until an upper surface of the pad nitride layer pattern 14 is exposed. The pad nitride layer pattern 14 and the pad oxide layer 12 are then removed to form an isolation layer 22 having an upper surface disposed above that of the semiconductor substrate 10. However, as shown in the figure, voids or seams V may be produced in the isolation layer 22 due to the overhang.

In order to prevent such voids or seams from being formed, the silicon oxide layer is etched (wet- or dry-etched) in an attempt to remove any overhang and thereby expand the entrance of the trench before the trench is filled. The trench is subsequently filled with additional silicon oxide. However, the etching process for expanding the entrance of the trench may still not provide the remaining trench with a sufficiently wide entrance which allows for the trench to be filled completely. Furthermore, in the case in which the etching process for expanding the entrance of the trench is a dry etching process, the pad oxide layer may be over-etched or damaged by the plasma used in the dry etching process.

SUMMARY OF THE INVENTION

An object of the present invention is to provide a method of filling a trench without leaving a void or seam in the material occupying the trench.

Similarly, an object of the present invention is to provide a method of forming an insulating layer structure that is free of voids or seams.

According to one aspect of the present invention, there is provided a method of filling a trench in a substrate, in which an entrance to the trench is widened during the course of filling the trench. A conformal preliminary insulating layer is first formed on the substrate. Thus, the preliminary insulating layer extends along the bottom and sides of the trench and along an upper surface of the substrate. Next, a region of the preliminary insulating layer adjacent an upper portion of the trench is doped and by selectively implanting impurities into the preliminary insulating layer. Then, the doped region of the preliminary insulating layer is removed to form a first insulating layer pattern which extend along the bottom and sides of the trench. The first insulating layer pattern is also a conformal layer so a to define a second trench. Subsequently the second trench is filled with an insulating material.

According to another aspect of the present invention, there is provided a method of forming a stable isolating layer structure. After a series of first trenches are formed in a substrate, a conformal preliminary isolating layer is formed on the substrate. Thus, the preliminary isolating layer extends along the bottom and sides of each of the first trenches and along an upper surface of the substrate. Next, a region of the preliminary insulating layer adjacent an upper portion of each of the first trenches is doped, and the doped region is removed. As a result, a portion of the preliminary insulating layer remains in each of the first trenches as a first insulating layer pattern. The first insulating layer pattern extends along the bottom and sides of each of the first trenches, the first insulating layer pattern defining second trenches. Subsequently, the second trenches are filled with insulating material.

Also, according to the present invention, the selective doping of the preliminary insulating layer may be carried out by executing an ion implantation process in which impurities strike the substrate at an angle of about 7° to about 45° with respect to a plane extending substantially perpendicular to an upper surface of the substrate. Alternatively, the impurities may be implanted using a plasma doping process.

Preferably, the impurities have a concentration of about $1 \times 10^{16}$ atoms/cm$^3$ to about $1 \times 10^{19}$ atoms/cm$^3$. Furthermore, the impurities may be implanted to a depth of about 10% to about 100% of the thickness of that portion of the preliminary insulating layer which lies on the substrate at the bottom of the trench. The impurities preferably include atoms of at least one element selected from the group consisting of germanium, silicon, boron, phosphorous, nitrogen, and argon.

The doped region of the preliminary insulating layer may be removed by an isotropic etching process, namely, a wet etching process. An additional dry etching process may be used after the wet etching process.

The present invention is particularly useful when the preliminary insulating layer is formed of an oxide by a high density plasma chemical vapor deposition (HDP-CVD) process. This is because such a process can produce an overhang in the layer, i.e., can produce a portion that overhangs the trench that is left. However, the preliminary insulating layer and the insulating material used to fill the trench may be oxides formed by a chemical vapor deposition (CVD) process, a low pressure chemical vapor deposition (LPCVD) process, a plasma-enhanced chemical vapor deposition process (PECVD) process, the aforementioned high density plasma chemical vapor deposition (HDP-CVD) process, or an atomic layer deposition (ALD) process.

BRIEF DESCRIPTION OF THE DRAWINGS

These and other objects, features and advantages of the present invention will be better understood from the following detailed description of the preferred embodiments thereof made in conjunction with the accompanying drawings. In the drawings.

DETAILED DESCRIPTION OF THE PREFERRED EMBODIMENTS

Figure 1A:
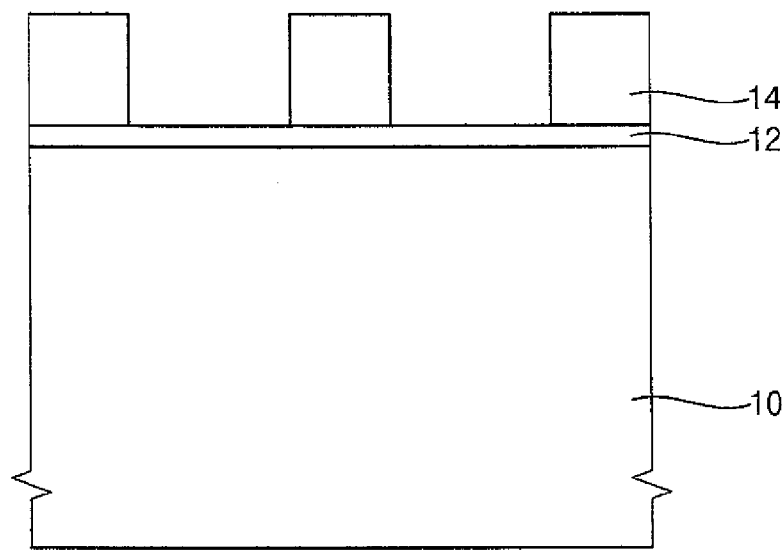
FIGS. 1A to 1D are cross-sectional views of a substrate and together illustrate a conventional method of forming an isolating layer structure.
Figure 1B:
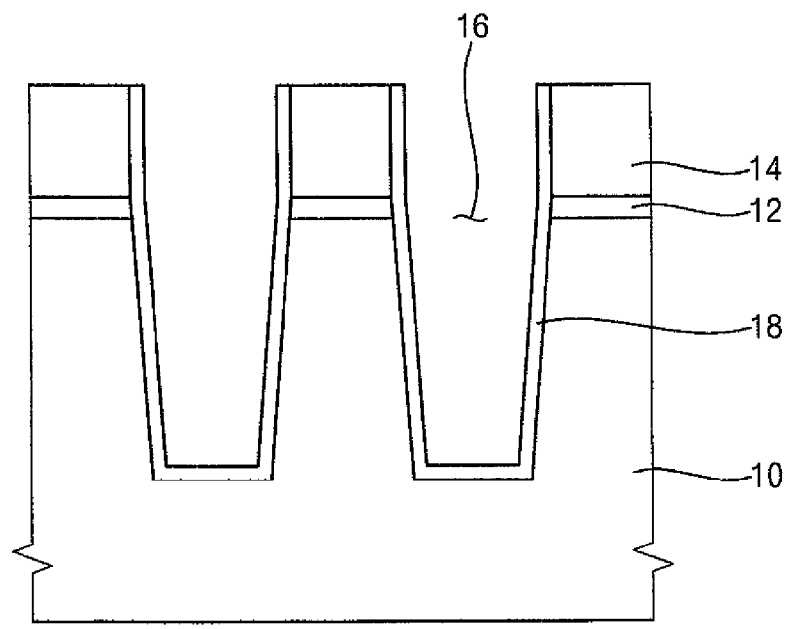
Figure 1C:
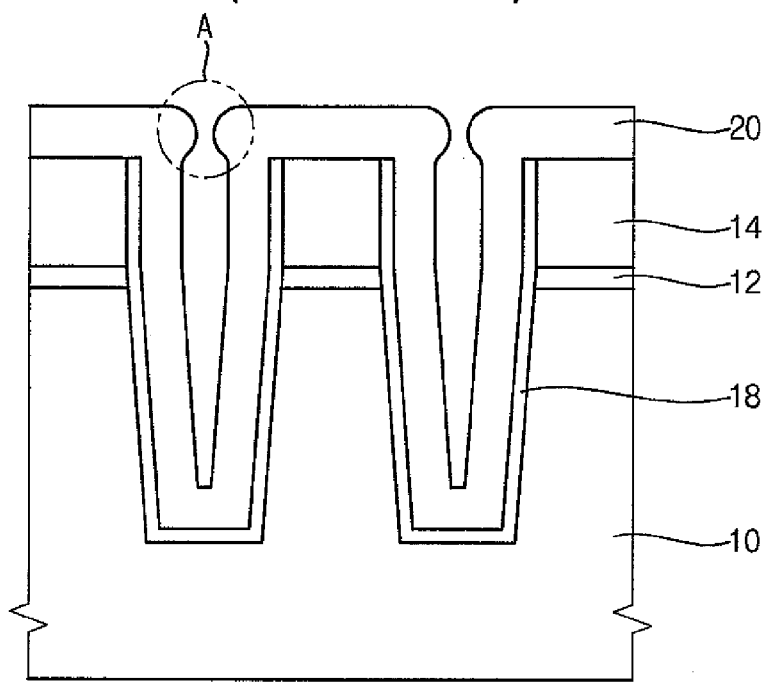
Figure 1D:
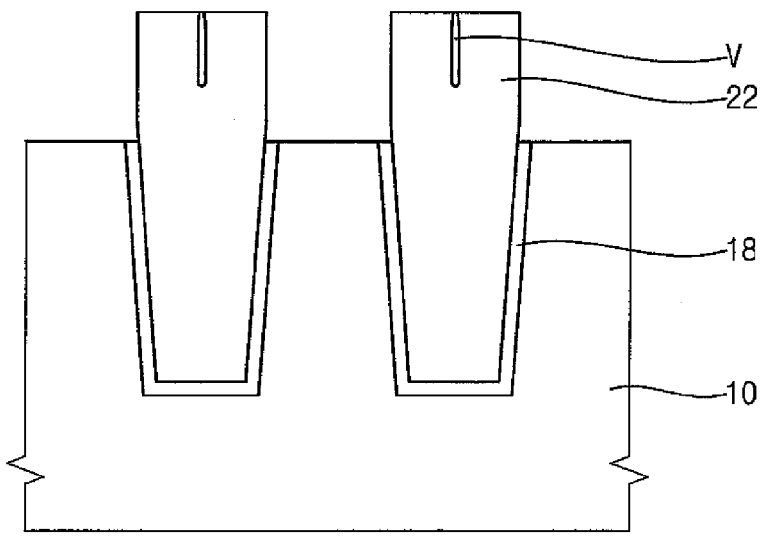

The present invention will be described more fully hereinafter with reference to the accompanying drawings. In the drawings, though, the sizes and relative sizes of layers and regions may be exaggerated for clarity. Likewise, the actual cross-sectional shapes of elements, layers, or regions may differ from those illustrated herein for ease in illustrating the invention and/or due to the vagaries of actual manufacturing processes. That is, the drawings are rather schematic in nature.

It will also be understood that when an element or layer is described as being "on," another element or layer, such a description encompasses both the case in which the element/layer is disposed directly on the other element as well as cases in which one or more elements or layers are present therebetween. Also, as used herein, the term "and/or" includes any and all combinations of one or more of the associated listed items.

A method of forming an isolation layer structure according to the present invention will now be described in detail with respect to FIGS. 2-6.

Figure 2:
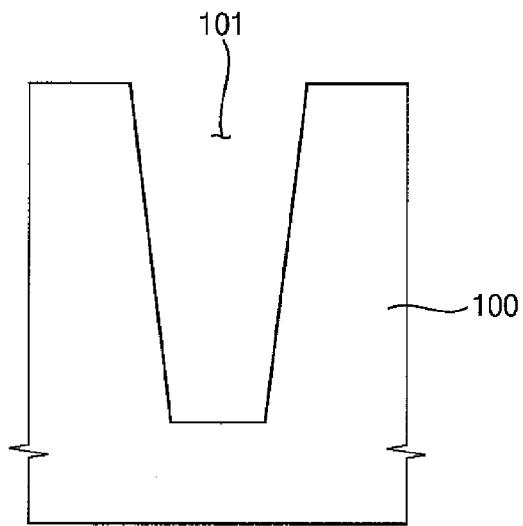
FIGS. 2 to 6 are cross-sectional views of a substrate and together illustrate an embodiment of a method of forming an isolating layer structure in accordance with the present invention.

Referring first to FIG. 2, a first trench 101 is formed in an upper portion of a semiconductor substrate 100. In this embodiment, the first trench 101 is formed by etching the semiconductor substrate 100 using a mask (not shown) disposed on the semiconductor substrate 100.

Figure 3:
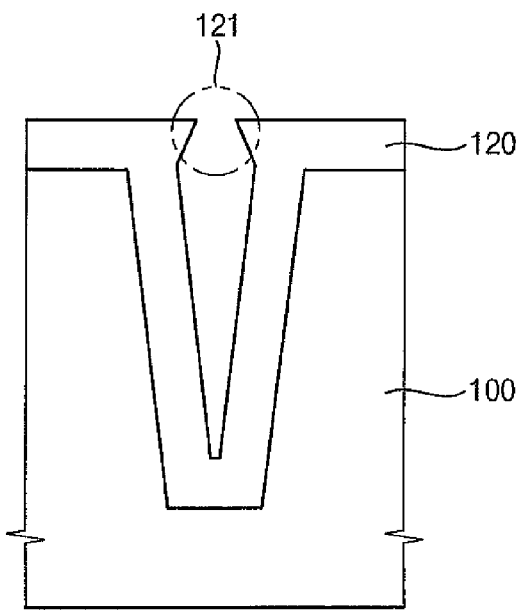

Referring to FIG. 3, after the mask is removed, a preliminary insulating layer 120 is formed on the substrate 100 so as to conform to the profile of the underlying structure, i.e., to the topography of the substrate 100 including the first trench 101. In this embodiment, the preliminary insulating layer 120 is a layer of silicon oxide. In this respect, the preliminary insulating layer 120 may comprise an undoped silicate glass (USG) layer, an $O_3$-tetra ethyl ortho silicate ($O_3$-TEOS) layer, a thermal oxidation layer, a phosphor silicate glass (PSG) layer, a borophosphor silicate glass (BPSG) layer, or a high density plasma (HDP) oxide layer.

In this embodiment, the preliminary insulating layer 120 is an HDP oxide layer considering that HDP oxide layers provide good step coverage and have good gap filling characteristics. Thus, the preliminary insulating layer 120 is formed by a high density plasma chemical vapor deposition (HDP-CVD) process which entails the sequential and alternate deposition and sputtering of silicon oxide. In the deposition part of the process, silicon oxide is deposited along the bottom and sides of the first trench 101. In contrast, in the sputtering part of the process, some of the deposited silicon oxide is detached from the substrate at the sides of the first trench 101. The detached material can adhere to material at the opposite side of the first trench 101. When the first trench 101 has a certain high aspect ratio, this redepositing of the silicon oxide occurs mainly at upper parts of the sides of the first trench 101. Therefore, the preliminary insulating layer 120 may have an overhanging portion 121 at the entrance to (upper opening of) the unfilled portion of the first trench 101.

In the alternative, when the preliminary insulating layer 120 comprises a TEOS layer, the TEOS layer is preferably formed using a source gas that includes a mixture of $O_3$ and TEOS. A TEOS layer formed using such a source gas is generally flatter than that of an oxide layer formed using silane ($SiH_4$) as a source gas.

Figure 4:
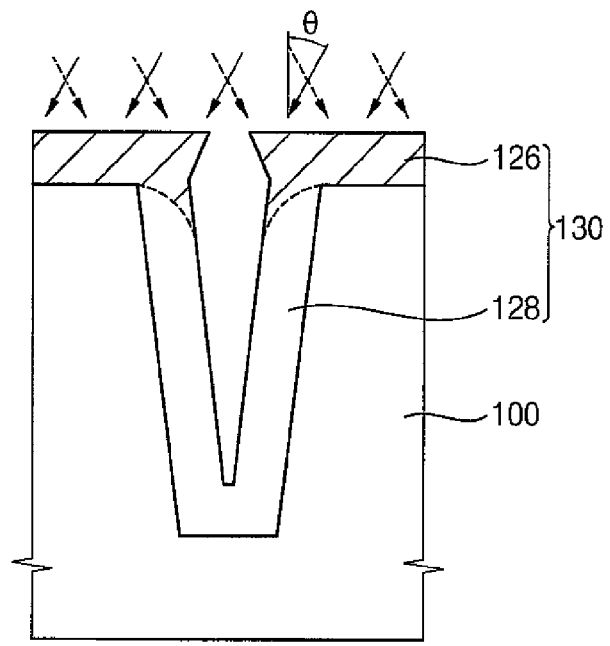

Referring to FIG. 4, impurities are then implanted into portions of the preliminary insulating layer 120 adjacent the upper parts of the sides of the first trench 101 to form a first insulating layer 130 having a doped region 126 and an undoped region 128. In this embodiment, the impurities have a concentration of about $1 \times 10^{16}$ atoms/cm$^3$ to about $1 \times 10^{19}$ atoms/cm$^3$. Also, the doped region 126 preferably has a depth of about 10% to about 100% of the thickness of the preliminary insulating layer 120 as measured at the bottom of the first trench 101. Furthermore, the impurities may include atoms of silicon, germanium, tin, or plumbum. Alternatively, the impurities may include atoms of one or more elements in group IIIA, such as boron, aluminum, gallium, indium, and thallium. Furthermore, the impurities may include atoms of elements in group VA such as nitrogen, sulfur, arsenic, antimony, and bismuth.

In this embodiment, the impurities are implanted by an ion implantation process in which ions impinge the preliminary insulating layer 120 while streaming obliquely with respect to the upper surface or plane of the substrate 100. For example, the impurities are implanted at an angle of about 7° to about 45° with respect to a plane extending substantially perpendicular to the upper surface of the semiconductor substrate 100. Accordingly, a portion of the preliminary insulating layer 120 on the upper surface of the semiconductor substrate 100 and a portion of the preliminary oxide layer 120 on the surface delimiting upper sides of the first trench 101 are doped. Therefore, the overhanging portion 121 of the preliminary insulating layer 120 (if formed) will be doped with the impurities.

Alternatively, the impurities may be implanted by a plasma doping process. According to the plasma doping process, plasma is produced from source gases comprising the impurities. A high bias voltage is applied to the semiconductor substrate 100 to accelerate cations in the plasma toward the preliminary insulating layer 120, thereby implanting the impurities into the preliminary insulating layer 120. In this process, the dosage of the ions implanted and the depth to which the ions are implanted can be controlled by the bias voltage applied to the semiconductor substrate 100. Thus, the portions of the preliminary insulating layer 120 adjacent to the upper sides of the first trench 101 only can be doped using the plasma doping process, i.e., the plasma doping process can be controlled to selectively dope the preliminary insulating layer 120.

Figure 5:
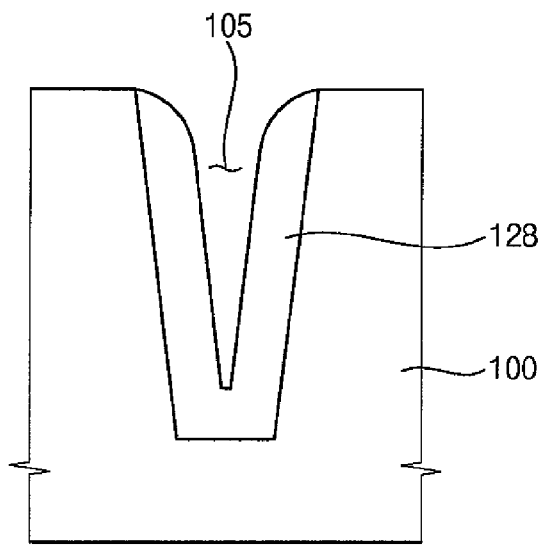

Referring to FIG. 5, the doped region 126 is then removed to form a second trench 105 defined by the undoped region 128. Specifically, the doped region 126 is etched. Accordingly, any overhanging portion 121 of the preliminary insulating layer 120 is removed. In this respect, the doping of the preliminary insulating layer 120 is carried out to provide an etch selectivity between the doped region 126 and the undoped region 128 with respect to the etching process or processes.

For example, in this embodiment, the doped region 126 is removed by a wet etch process, i.e., an isotropic etching process, followed by a dry etch process. When the doped region 126 is an oxide layer doped with impurities, a standard cleaning solution (SC-1) or a new standard cleaning solution (NSC-1) may be used as the etching solution in the wet etch process. SC-1 solution and NSC-1 solution include ammonium nitride, hydrogen peroxide and water. The dry etching process uses a reaction gas (etchant) including fluorine and nitrogen. For example, the reaction gas includes a hydrofluoric gas and ammonia. Furthermore, argon may be used as a carrier gas in the dry etching process.

The remaining undoped region 128 constitutes a first insulating layer pattern extending along the bottom and sides of the first trench 101. Reference numeral 128 will be used hereinafter to designate the first insulating layer pattern formed of the undoped region of the first isolating layer 130. The second trench 105 defined by the first insulating layer pattern 128 is wider at its upper portion than at its lower portion. Therefore, the second trench 105 can be easily and readily filled completely with insulating material, i.e., without voids or seams being produced.

Figure 6:
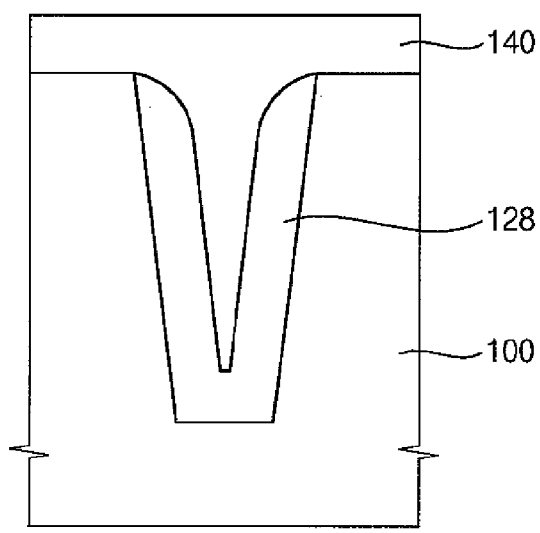

That is, referring to FIG. 6, a second insulating layer 140 is formed on the first insulting layer pattern 128 to fill the second trench 105. At this time, the second trench 105 may be filled completely by the second insulating layer 140. The second insulating layer 140 may comprise silicon oxide and may be formed by a CVD process. For example, the second insulating layer 140 may comprise an undoped silicate glass (USG) layer, an $O_3$-tetra ethyl ortho silicate ($O_3$-TEOS) layer, a thermal oxidation layer, a phosphor silicate glass (PSG) layer, or a borophosphor silicate glass (BPSG) layer.

In this embodiment, though, the second insulating layer 140 is a USG layer formed by an HDP-CVD process. Therefore, the USG layer provides good step coverage and has a good gap filling characteristic. In the alternative, when the second insulating layer 140 comprises a TEOS layer, the TEOS layer is preferably formed using a source gas that includes a mixture of $O_3$ and TEOS. As mentioned above, a TEOS layer formed using such a source gas is generally flatter than that of an oxide layer formed using silane ($SiH_4$) as a source gas.

FIGS. 7 to 12 illustrate another method of forming an isolating layer structure in accordance with the present invention.

Figure 7:
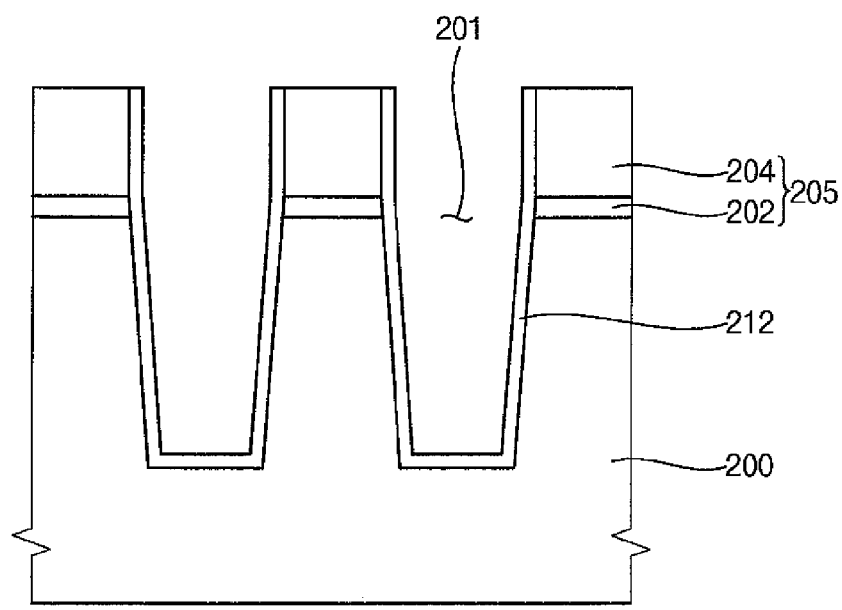
FIGS. 7 to 12 are cross-sectional views of a substrate and together illustrate another embodiment of a method of forming an isolating layer structure in accordance with the present invention.

Referring to FIG. 7, a mask 205 is formed on a semiconductor substrate 200.

More specifically, in this embodiment, the semiconductor substrate 200 comprises silicon, and a pad oxide layer (not shown) is formed on the semiconductor substrate 200. The pad oxide layer has a thickness of about 50 Å to about 200 Å, and preferably a thickness of 100 Å. The pad oxide layer may be formed by a thermal oxidation process or a CVD process. A pad nitride layer (not shown) is then formed on the pad oxide layer. (Note, the pad oxide layer serves to reduce stress generated when the nitride layer is formed on the semiconductor substrate 200.) In this embodiment, the pad nitride layer comprises silicon nitride. Furthermore, the pad nitride layer is formed by an LPCVD process or a PECVD process using $SiH_2Cl_2$, $SiH_4$, and $NH_3$. A photoresist pattern (not shown) is then formed on the pad nitride layer. The photoresist pattern is formed by coating the pad nitride layer with a photoresist material having a uniform thickness, baking the photoresist material to form a photoresist film, and exposing and developing the photoresist film all according to techniques known per se. The pad nitride layer and the pad oxide layer are then etched using the photoresist pattern as an etch mask to form the mask pattern 205. Hence, the mask pattern 205 includes a pad oxide layer pattern 202 and a pad nitride layer pattern 204. The photoresist pattern is then removed by an ashing process and/or a stripping process.

The substrate 200 is then etched using the mask 205 to form first trenches 201. More specifically, portions of the semiconductor substrate 200 exposed by the mask 205 are removed. In this embodiment, the ratio of the width to depth of each first trench 201 is about 1:3 to about 1:20. (In this respect, the width of the first trench 201 is that of the entrance of the first trench 201, i.e., the opening defined by the trench at the upper surface of the mask 205). For example, each first trench 201 may have a depth of about 1,500 Å to about 8,000 Å and a width of about 400 Å to about 500 Å.

The first trenches 201 divide the semiconductor substrate 200 into an active region, on which electronic components are formed, and a field region. Furthermore, the semiconductor substrate 200 may have a cell region where, for example, memory devices are formed, and a peripheral region. In this case, the first trenches 201 facilitate a higher degree of integration in the cell region than in the peripheral region. In particular, the first trenches 201 in the cell region may be narrower than the first trenches 201 in the peripheral region.

Next, a liner layer 212 is formed on surfaces of the semiconductor substrate 200 delimiting the first trenches 201. The liner layer 212 serves to cure damage to the semiconductor substrate 200, caused when the first trench 201 is formed, and to prevent leakage current. The liner layer 212 may be formed by thermally treating the semiconductor substrate 200 at a temperature of about 740° C. to about 760° C. or by forming a nitride layer on such surfaces. In the case in which the liner layer 212 is formed by thermally treating the semiconductor substrate 200, the liner layer 212 may have a thickness of about 90 Å to about 100 Å.

Figure 8:
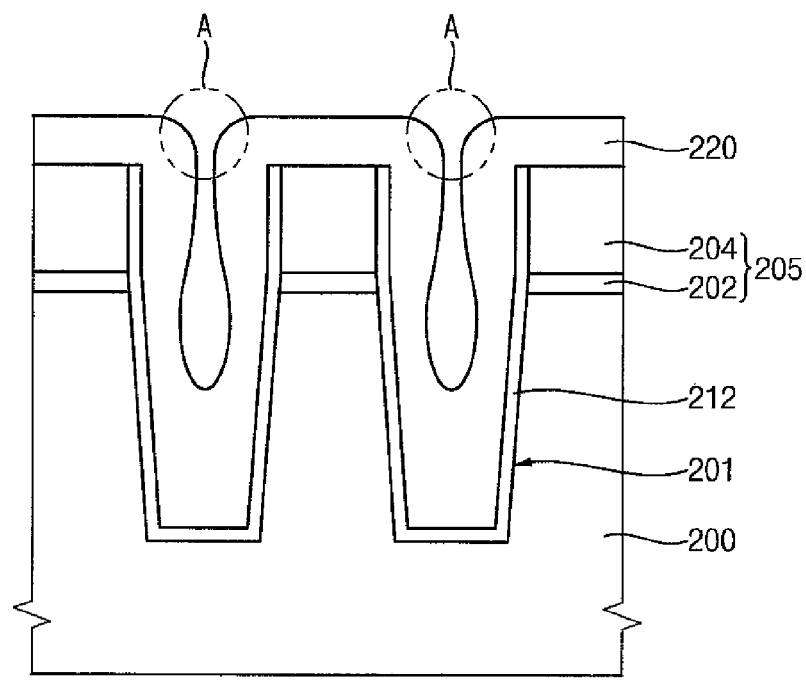

Referring to FIG. 8, a preliminary isolating layer 220 is then formed on the substrate, namely on the structure formed by the semiconductor substrate 200, mask 205 and liner layer 212. The preliminary isolating layer 220 conforms to the profile of the underlying substrate, i.e., to the topography of the exposed surfaces of the liner layer 212 and the exposed upper surface of the nitride layer pattern 204.

In this embodiment, the preliminary isolating layer 220 comprises silicon oxide. More specifically, the preliminary isolating layer 220 may comprise an undoped silicate glass (USG) layer, an $O_3$-tetra ethyl ortho silicate ($O_3$-TEOS) layer, a thermal oxidation layer, a phosphor silicate glass (PSG) layer, or a borophosphor silicate glass (BPSG) layer.

In this embodiment, the preliminary insulating layer 220 is an HDP oxide layer considering that HDP oxide layers provide good step coverage and have good gap filling characteristics. Thus, the preliminary insulating layer 220 is formed by a high density plasma chemical vapor deposition (HDP-CVD) process. The HDP-CVD process is carried out at a temperature of about 500° C. to about 600° and under a pressure of about 550 Torr to about 700 Torr. Furthermore, oxygen and silane are used as source gas, and hydrogen, helium or argon is used as a carrier gas.

Such an HDP-CVD process entails the sequential and alternate deposition and sputtering of silicon oxide. In the deposition part of the process, silicon oxide is deposited along the bottom and sides of the first trenches 201. In contrast, in the sputtering part of the process, some of the deposited silicon oxide is detached from the substrate at the sides of the first trenches 201. The detached material can adhere to material at the opposite sides of the first trenches 201. When the first trenches 201 have a certain high aspect ratio, this re-depositing of the silicon oxide occurs mainly at upper parts of the sides of the first trenches 201. Therefore, the preliminary insulating layer 220 may have an overhanging portion "A" at the entrance to (upper opening of) the unfilled portion of a first trench 101.

In the alternative, when the preliminary insulating layer 220 comprises a TEOS layer, the TEOS layer is preferably formed using a source gas that includes a mixture of $O_3$ and TEOS. A TEOS layer formed using such a source gas is generally flatter than that of an oxide layer formed using silane ($SiH_4$) as a source gas.

Figure 9:
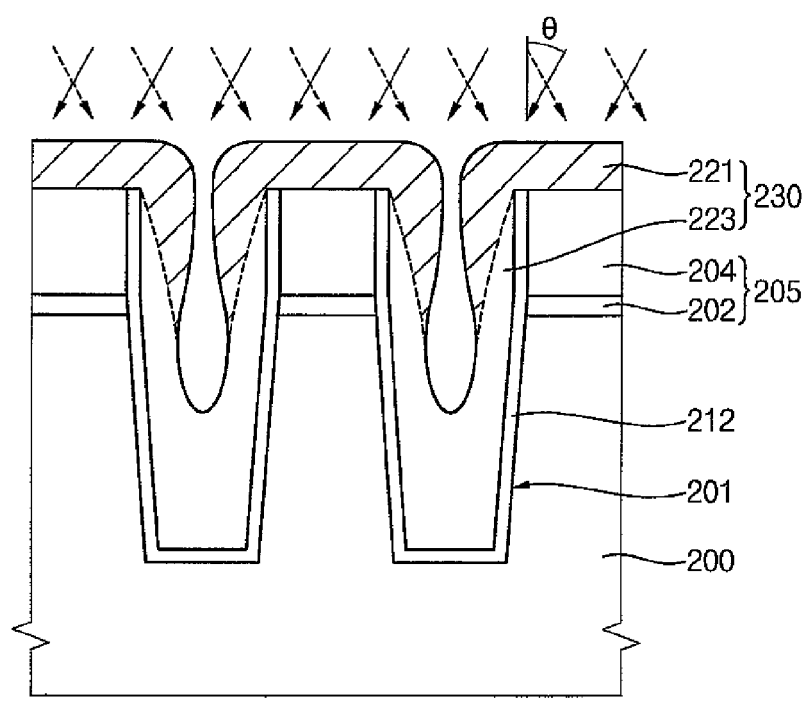

Referring to FIG. 9, impurities are selectively implanted into the preliminary isolating layer 220. More specifically, impurities are implanted into portions of the preliminary isolating layer 220 adjacent to the upper part of the first trench 201. That is, a portion of the preliminary isolating layer 220 on the mask pattern 205 and a portion of the preliminary oxide layer 220 on the upper part of the sides of the first trench 201 are doped with the impurities to form a first isolating layer 230 having a doped region 221 and an undoped region 223. As a result, the doped region 221 can be etched at a higher rate than the undoped region 223 with respect to a certain etching process, in this case an isotropic etching process.

The impurities may be implanted at a concentration of about $1 \times 10^{16}$ atoms/$cm^3$ to about $1 \times 10^{19}$ atoms/$cm^3$. Furthermore, the depth to which the impurities are implanted in the preliminary isolating layer 220 is preferably about 10% to about 100% of the thickness of the preliminary isolating layer 220 as measured at the bottom of the first trench 201. Furthermore, the impurities may include atoms of silicon, germanium, tin, or plumbum. Alternatively, the impurities may include atoms of one or more elements in group IIIA such as boron, aluminum, gallium, indium, and thallium. Furthermore, the impurities may include atoms of elements in group VA such as nitrogen, sulfur, arsenic, antimony, and bismuth.

In this embodiment, the impurities are implanted by an ion implantation process in which ions impinge the preliminary insulating layer 220 while streaming obliquely with respect to the upper surface or plane of the substrate 100. For example, the impurities are implanted at an angle of about 7° to about 45° with respect to a plane extending substantially perpendicular to the upper surface of the semiconductor substrate 200. Accordingly, a portion of the preliminary insulating layer 220 on the upper surface of the semiconductor substrate 200 and a portion of the preliminary oxide layer 220 on the surface delimiting upper sides of the first trenches 201 are doped. That is, each overhanging portion "A" of the preliminary insulating layer 220 (if formed) will be doped with the impurities.

Alternatively, the impurities may be implanted by a plasma doping process. According to the plasma doping process, plasma is produced from source gases comprising the impurities. A high bias voltage is applied to the semiconductor substrate 200 to accelerate cations in the plasma toward the preliminary insulating layer 220, thereby implanting the impurities into the preliminary insulating layer 220. In this process, the dosage of the ions implanted and the depth to which the ions are implanted can be controlled by the bias voltage applied to the semiconductor substrate 200. Thus, the portions of the preliminary insulating layer 220 adjacent to the upper sides of the first trenches 201 only can be doped using the plasma doping process, i.e., the plasma doping process can be controlled to selectively dope the preliminary insulating layer 220.

Figure 10:
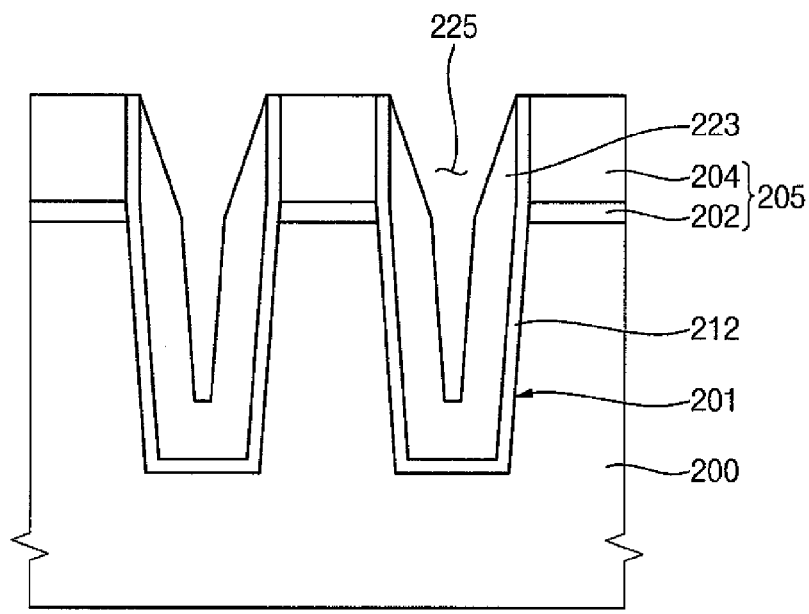

Referring to FIG. 10, first isolating layer 230 is selectively etched. More specifically, the doped region 221 of the first isolating layer 230 is removed. Thus, any overhanging portion of the first isolating layer 230, i.e., any portion of the first isolating layer 230 which overhangs what is left of a trench, is removed.

For example, in this embodiment, the doped region 221 is removed by a wet etch process, i.e., an isotropic etching process, followed by a dry etch process. When the doped region 221 is an oxide layer doped with impurities, a standard cleaning solution (SC-1) or a new standard cleaning solution (NSC-1) may be used as the etching solution in the wet etch process. SC-1 solution and NSC-1 solution include ammonium nitride, hydrogen peroxide and water. The dry etching process uses a reaction gas (etchant) including fluorine and nitrogen. For example, the reaction gas includes a hydrofluoric gas and ammonia. Furthermore, argon may be used as a carrier gas in the dry etching process. However, the dry etching process preferably does not use a bias power so that the surface of the semiconductor substrate 200 will not be damaged by plasma when removing the doped region 221.

The remaining undoped region 223 constitutes a first insulating layer pattern extending along the bottom and sides of each first trench 201. Reference numeral 223 will be used hereinafter to designate the first insulating layer pattern formed of the undoped region of the first isolating layer 230. The second trench 225 defined by the first insulating layer pattern 223 is wider at its upper portion than at its lower portion. Therefore, the second trench 225 can be easily and readily filled completely with insulating material, i.e., without voids or seams being produced.

Figure 11:
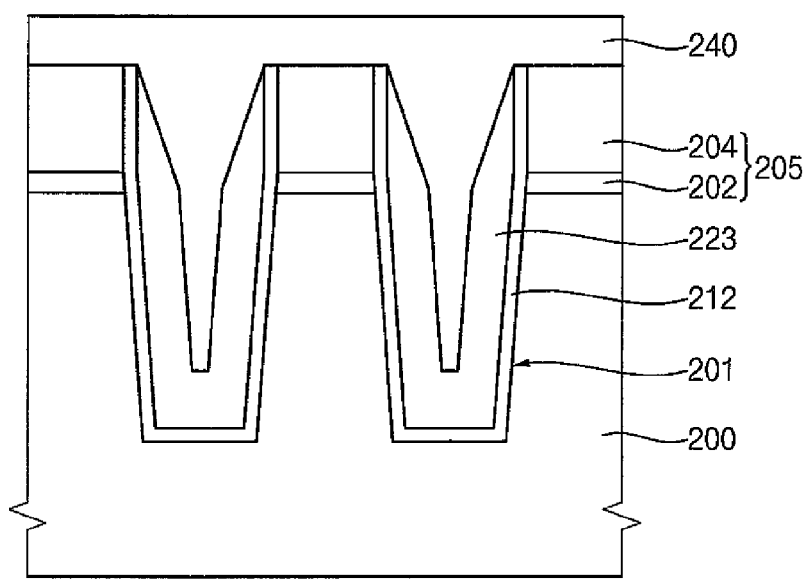

That is, referring to FIG. 11, a second insulating layer 240 is formed on the first insulting layer pattern 223 to fill the second trench 225. At this time, the second trench 225 may be filled completely by the second insulating layer 240. The second insulating layer 240 may comprise silicon oxide and may be formed by a CVD process. For example, the second insulating layer 240 may comprise an undoped silicate glass (USG) layer, an $O_3$-tetra ethyl ortho silicate ($O_3$-TEOS) layer, a thermal oxidation layer, a phosphor silicate glass (PSG) layer, or a borophosphor silicate glass (BPSG) layer.

In this embodiment, the second insulating layer 240 is a USG layer formed by an HDP-CVD process. Therefore, the USG layer provides good step coverage and has a good gap filling characteristic. Therefore, the second trench 225 can be easily and readily filled completely with insulating material even if the second trench 225 has an aspect ratio lower than that of the first trench 201. In the alternative, when the second insulating layer 240 comprises a TEOS layer, the TEOS layer is preferably formed using a source gas that includes a mixture of $O_3$ and TEOS. As mentioned above, a TEOS layer formed using such a source gas is generally flatter than that of an oxide layer formed using silane ($SiH_4$) as a source gas.

After the deposition process is carried out, the second isolating layer 240 may be thermally treated to reflow the second isolating layer 240. Specifically, the second isolating layer 240 may be heated at a temperature of about 700° C. to about 800° C. for about 30 minutes under a vapor atmosphere to densify the second isolating layer 240. Reflowing the second isolating layer 240 in this way can ensure that the second trench 205 is filled completely. Also, at this time, any seams in the second isolating layer 240 are expanded by the vapor. The flowing material of the second isolating layer 240 easily fills the expanded seams, thereby forming a densified second isolating layer 240 in the second trench 240.

Figure 12:
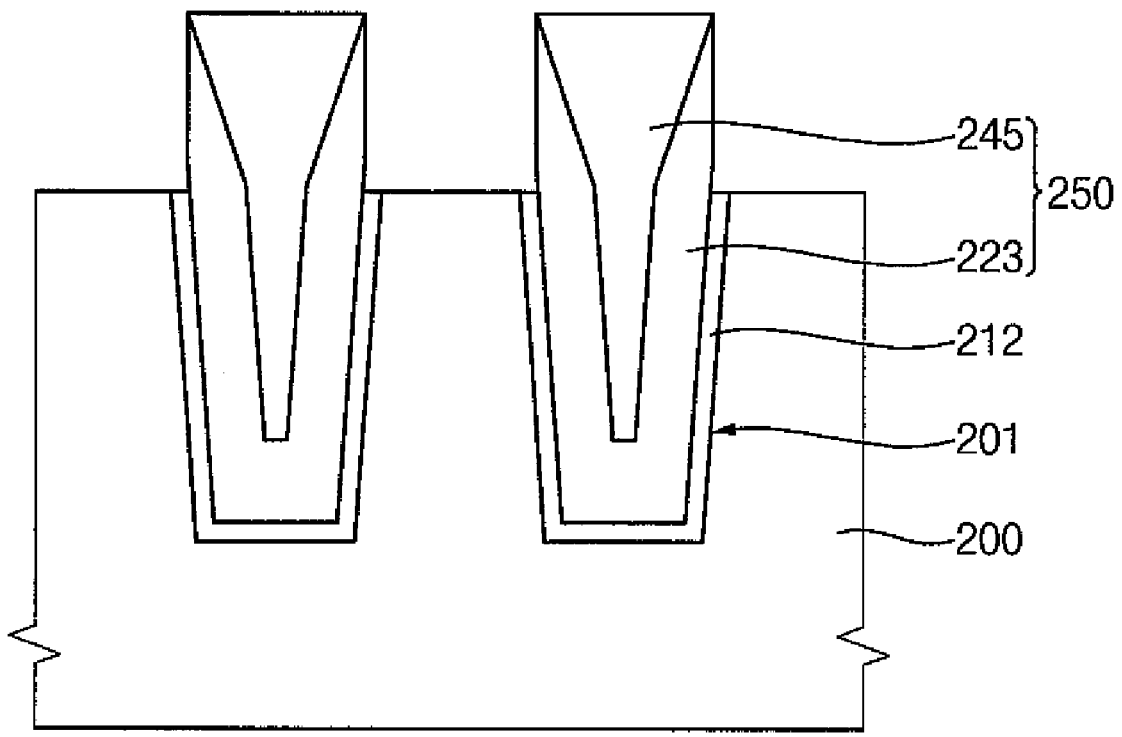

Referring to FIG. 12, the second isolating layer 240 may be planarized until the mask pattern 205 is exposed to form a second isolating layer pattern 245. In this embodiment, the planarization process includes CMP.

The mask pattern 205 is then removed using a wet etching solution. More specifically, the pad nitride layer pattern 204 is removed using a wet etching solution including phosphorous acid. The pad oxide layer pattern 202 is then removed by a wet etching process For example, the pad oxide layer pattern 202 is removed by an LAL solution.

As a result, the active region of the semiconductor substrate 200 and upper portions of the first insulating layer pattern 223 are exposed. Also, the first insulating layer pattern 223 and the second isolating layer pattern 245 form an isolating layer structure 250 that eclectically isolates segments of the active region from one another. The isolating layer structure 250 has an upper surface located above that of the semiconductor substrate 200.

Although not depicted in drawings, a non-volatile memory device such as a flash memory device, may be formed on the active region. First, a floating gate is formed on the active region. In this case, the upper surface of the isolating layer structure 250 is disposed above that of a floating gate. Then, a dielectric layer and a polysilicon layer are sequentially formed on the substrate 200. The polysilicon layer and the dielectric layer are then patterned to form a control gate pattern and a dielectric layer pattern on the floating gate. That is, a gate structure is formed on the active region of the semiconductor substrate 200.

According to the present invention as described above, a preliminary isolating layer that partially fills a trench is selectively doped. The doped region is removed by a selective etching process to form a second trench that is wider at its top than at its bottom. Thus, voids or seams will not be produced in the isolating layer when the second trench is filled with additional insulating material.

Furthermore, any portion of the preliminary isolating layer which overhangs the first trench is doped. Thus, the present invention ensures that any overhanging portions of the preliminary isolating layer are removed before the trench is filled completely. Thus, the present invention also ensures that voids or seams are not produced in the insulating material occupying the trench, even when a process such as an HDP-CVD process is used to fill the trench.

The foregoing description of the preferred embodiments is illustrative of the present invention and is not to be construed as limiting. For example, the present invention has been described as being especially useful when a high density plasma chemical vapor deposition (HDP-CVD) process is employed to form the preliminary insulating layer of silicon oxide. However, the present invention is not so limited. Rather, the preliminary insulating layer and the second insulating layer may each be formed by a regular chemical vapor deposition (CVD) process, a low pressure chemical vapor deposition (LPCVD) process, a plasma-enhanced chemical vapor deposition process (PECVD) process, the aforementioned high density plasma chemical vapor deposition (HDP-CVD) process, or an atomic layer deposition (ALD) process. Moreover, other changes to and modifications of the disclosed embodiments will become apparent to those skilled in the art. Accordingly, changes to and modifications of the disclosed embodiments may fall within the true spirit and scope of the invention as defined by the following claims.

What is claimed is:

1. A method for use in the fabricating of a semiconductor device, the method comprising:

providing a substrate having a first trench extending therein from an upper surface of the substrate such that the first trench has an opening at the upper surface, which opening constitutes an entrance to the first trench;

forming a preliminary insulating layer on the substrate in conformance with the topography of the substrate including the first trench and to such a thickness that the preliminary insulating layer extends along the bottom and sides of the first trench and along an upper surface of the substrate, the first trench has an unfilled portion at which part of the entrance to the first trench remains open at the top of the substrate, and the preliminary insulating layer has at the entrance an overhanging portion that overhangs an upper unfilled portion of the first trench;

while the first trench still has an unfilled portion at which part of the entrance to the first trench remains open at the top of the substrate, doping the overhanging portion of the preliminary insulating layer and the portion of the preliminary insulating layer extending along upper surface of the substrate by selectively implanting impurities into the preliminary insulating layer;

removing the doped region of the preliminary insulating layer to form a first insulating layer pattern which extends along the bottom and sides of the first trench, the first insulating layer pattern defining a second trench; and subsequently filling the second trench with an insulating material.

2. The method of claim 1, wherein the implanting of the impurities comprises striking the substrate with impurities streaming at an angle of about 7° to about 45° with respect to a plane extending perpendicular to the upper surface of the substrate.

3. The method of claim 1, wherein the implanting of the impurities comprises accelerating plasma towards the substrate.

4. The method of claim 1, wherein the impurities have a concentration of about $1\times10^{16}$ atoms/cm$^3$ to about $1\times10^{19}$ atoms/cm$^3$.

5. The method of claim 1, wherein the impurities are implanted to a depth of about 10% to about 100% of the thickness of the preliminary insulating layer as measured at the bottom of the trench.

6. The method of claim 1, wherein the impurities comprise atoms of at least one element selected from the group consisting of germanium, silicon, boron, phosphorous, nitrogen and argon.

7. The method of claim 1, wherein the removing of the doped region comprises isotropically etching the preliminary insulating layer.

8. The method of claim 7, wherein the isotropic etching of the preliminary insulating layer comprises wet etching the preliminary insulating layer.

9. A method of forming an isolating layer structure, the method comprising:

forming a series of first trenches in a substrate such that each of the first trenches has an opening at the upper surface, which opening constitutes a respective entrance to the first trench;

forming a preliminary isolating layer in conformance with the topography of the substrate including the first trenches and to such a thickness that the preliminary isolating layer extends along the bottom and sides of each of the first trenches and along an upper surface of the substrate, the first trenches each have an unfilled portion at which part of the entrance to the first trench remains open at the top of the substrate, and the preliminary isolating layer has at the entrances overhanging portions that respectively overhang upper unfilled portions of the first trenches;

while the first trenches still have unfilled portions at which part of the entrance to each of the first trenches remains open at the top of the substrate, doping the overhanging portions of the preliminary isolating layer and the portion of the preliminary isolating layer extending along the upper surface of the substrate by selectively implanting impurities into the preliminary isolating layer;

removing the doped region of the preliminary isolating layer to form a first isolating layer pattern which extends along the bottom and sides of each of the first trenches, the first isolating layer pattern defining second trenches; and subsequently filling the second trenches with an insulating material.

10. The method of claim 9, wherein the implanting of the impurities comprises striking the substrate with impurities streaming at an angle of about 720 to about 45° with respect to a plane extending perpendicular to the upper surface of the substrate.

11. The method of claim 9, wherein the implanting of the impurities comprises accelerating plasma towards the substrate.

12. The method of claim 9, wherein the impurities have a concentration of about $1\times10^{16}$ atoms/cm$^3$ to about $1\times10^{19}$ atoms/cm$^3$.

13. The method of claim 9, wherein the impurities are implanted to a depth by about 10% to about 100% of the thickness of the preliminary isolating layer as measured at the bottom surface of the first trench.

14. The method of claim 9, wherein the impurities comprise atoms of at least one element selected from the group consisting of germanium, silicon, boron, phosphorous, nitrogen and argon.

15. The method of claim 9, wherein the removing of the doped region comprises isotropically etching the preliminary isolating layer.

16. The method of claim 15, wherein the isotropic etching of the preliminary isolating layer comprises wet etching the preliminary isolating layer.

17. The method of claim 16, wherein the removing of the doped region comprises dry etching the preliminary isolating layer after the preliminary isolating layer is wet etched.

18. The method of claim 9, wherein the forming of the preliminary isolating layer and the filling of the second trenches each comprises forming an oxide layer on the substrate.

19. The method of claim 9, wherein the forming of the preliminary isolating layer comprises forming a high density plasma chemical vapor deposition (HDP-CVD) process.

20. The method of claim 9, wherein the forming of the first trenches in the substrate comprises forming a mask on a semiconductor substrate, and etching the semiconductor substrate using the mask, and the forming of the preliminary isolating layer is carried out while the mask remains on the semiconductor substrate, whereby the preliminary isolating layer extends along an upper surface of the mask.

* * * * *